United States Patent
Chen et al.

(10) Patent No.: US 9,432,030 B2
(45) Date of Patent: Aug. 30, 2016

(54) CIRCUIT AND OPERATING METHOD OF PLL

(71) Applicant: TAIWAN SEMICONDUCTOR MANUFACTURING COMPANY, LTD., Hsinchu (TW)

(72) Inventors: Yen-Jen Chen, Taipei (TW); Hsieh-Hung Hsieh, Taipei (TW); Chewn-Pu Jou, Hsinchu (TW); Fu-Lung Hsueh, Kaohsiung (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 114 days.

(21) Appl. No.: 14/097,504

(22) Filed: Dec. 5, 2013

(65) Prior Publication Data

US 2015/0162921 A1 Jun. 11, 2015

(51) Int. Cl.
*H03L 7/06* (2006.01)
*H03L 7/087* (2006.01)

(52) U.S. Cl.
CPC ................................. *H03L 7/087* (2013.01)

(58) Field of Classification Search
CPC ... H03L 2207/50; H03L 7/08; H03L 7/0995; H03L 7/07; H03L 7/099; H03L 7/00; H03L 7/085; H03L 7/087
USPC .................................. 327/156, 158; 375/327
See application file for complete search history.

(56) References Cited

U.S. PATENT DOCUMENTS

| | | | |
|---|---|---|---|
| 6,794,912 B2 * | 9/2004 | Hirata et al. | 327/158 |
| 7,202,718 B2 * | 4/2007 | Lindner et al. | 327/157 |
| 7,548,123 B2 | 6/2009 | Frey | |
| 7,737,743 B1 * | 6/2010 | Gao et al. | 327/158 |
| 8,692,599 B2 * | 4/2014 | Gong | H03L 7/081 327/156 |
| 2010/0259305 A1 | 10/2010 | Lee et al. | |

* cited by examiner

*Primary Examiner* — Lincoln Donovan
*Assistant Examiner* — Diana J Cheng
(74) *Attorney, Agent, or Firm* — Hauptman Ham, LLP (57) ABSTRACT

A phase locked loop (PLL) includes a voltage controlled oscillator (VCO), a loop filter, and a feedback control unit. The VCO is configured to generate a first oscillating signal and a second oscillating signal according to a VCO control signal. The loop filter is configured to output the VCO control signal by low-pass filtering a signal at an input node of the loop filter. The feedback control unit has an output node coupled to the input node of the loop filter, the feedback control unit is configured to apply a first predetermined amount of current, along a first current direction, to the first feedback control output node during a variable period of time; and to apply one of K second predetermined amounts of current, along a second current direction opposite the first current direction, to the first feedback control output node during a predetermined period of time.

20 Claims, 4 Drawing Sheets

CIRCUIT AND OPERATING METHOD OF PLL

RELATED APPLICATIONS

The instant application is related to U.S. Patent Application titled "DIVIDER-LESS PHASE LOCKED LOOP (PLL)," filed on Aug. 15, 2012, U.S. application Ser. No. 13/586,033, now U.S. Pat. No. 8,890,626, issued Nov. 18, 2014. The entire contents of the above-referenced application are incorporated by reference herein.

BACKGROUND

A Phase Locked Loop (PLL) is an electrical circuit usable to generate a synthesized oscillating signal according to a reference signal. In some applications, such as in a radio frequency synthesizer circuit, the frequency of the synthesized oscillating signal is so high that direct comparison of the synthesized oscillating signal and the reference signal is technically and/or economically infeasible. Under these circumstances, a PLL usually uses a frequency divider to generate a pre-scaled feedback signal based on the synthesized oscillating signal divided by a predetermined ratio N or (N+f), where N is a positive integer, and f is a fraction. The synthesized oscillating signal is then considered to be "locked" with the reference signal when the frequency and/or phase of the pre-scaled feedback signal and that of the reference signal are substantially the same. In many applications, a significant portion of overall power consumption of the PLL is attributable to the operation of the frequency divider.

DESCRIPTION OF THE DRAWINGS

One or more embodiments are illustrated by way of example, and not by limitation, in the figures of the accompanying drawings, wherein elements having the same reference numeral designations represent like elements throughout.

DETAILED DESCRIPTION

It is understood that the following disclosure provides one or more different embodiments, or examples, for implementing different features of the disclosure. Specific examples of components and arrangements are described below to simplify the present disclosure. These are, of course, examples and are not intended to be limiting. In accordance with the standard practice in the industry, various features in the drawings are not drawn to scale and are used for illustration purposes only.

Figure 1:
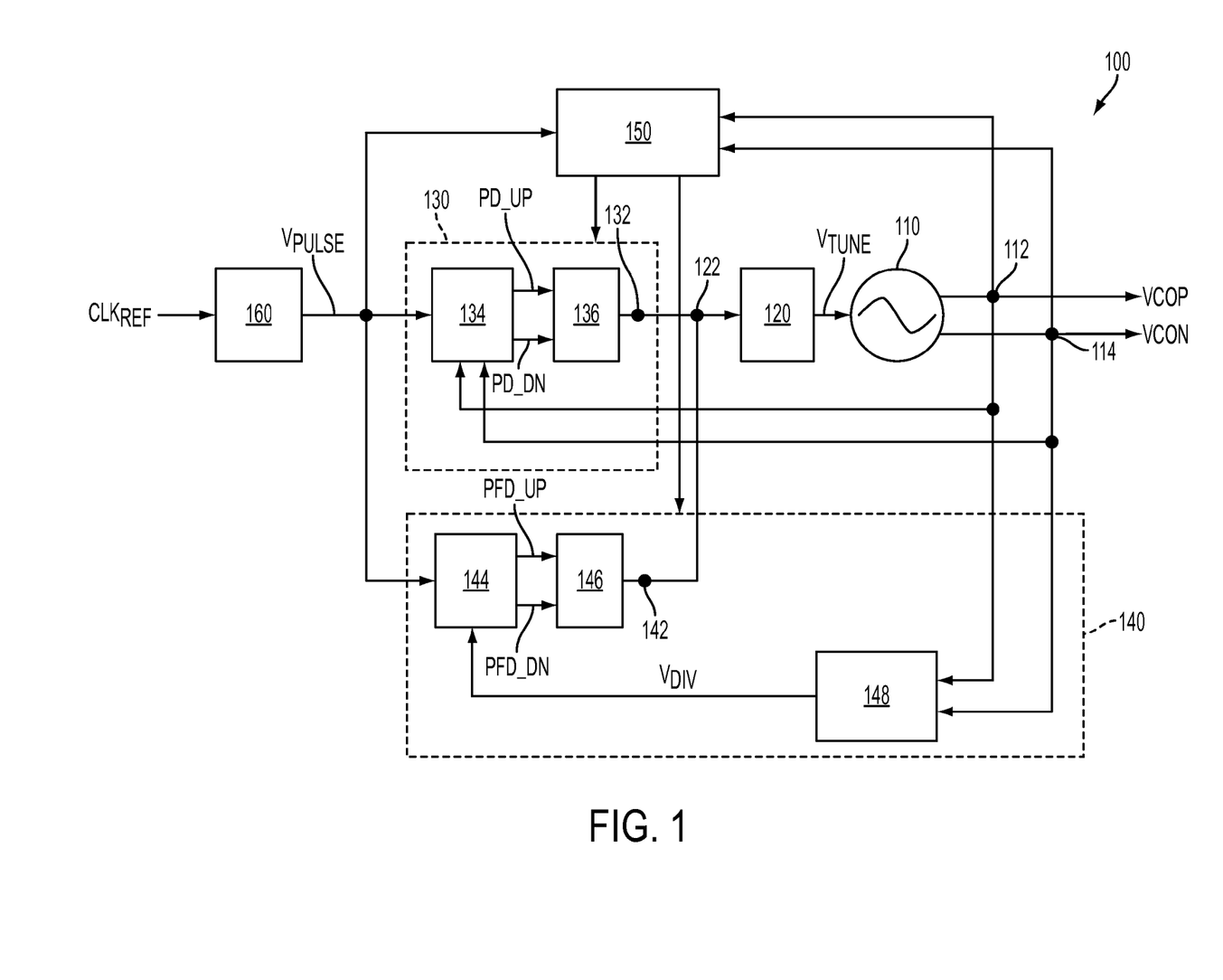
FIG. 1 is a schematic diagram of a Phase Locked Loop (PLL) in accordance with one or more embodiments.

FIG. 1 is a schematic diagram of a Phase Locked Loop (PLL) 100 in accordance with one or more embodiments. Phase Locked Loop (PLL) 100 includes a voltage controlled oscillator (VCO) 110, a loop filter 120, a first feedback control unit 130, a second feedback control unit 140, a controller 150, and a pulse generator 160. VCO 110 includes a first output node 112 and a second output node 114. VCO 110 is configured to generate a first oscillating signal VCOP at first output node 112 and a second oscillating signal VCON at second output node 114 responsive to a VCO control signal $V_{TUNE}$. Second oscillating signal VCON is an inverted version of first oscillating signal VCOP. First and second oscillating signals VCOP and VCON have a predetermined VCO frequency $F_{VCO}$ and a corresponding VCO period $T_{VCO}$. In some embodiments, VCO frequency $F_{VCO}$ ranges from 100 MHZ to 40 GHz.

In some embodiments, VCO 110 is an inductance-capacitance (LC) tank oscillator. In some embodiments, VCO 110 is a ring oscillator. In some embodiments, VCO frequency $F_{VCO}$ is controllable by adjusting an inductance, a capacitance, a delay, or a driving capability of VCO 110.

Loop filter 120 includes an input node 122 and is a low pass filter configured to output the VCO control signal $V_{TUNE}$ by low-pass filtering a signal at input node 122. In some embodiments, loop filter 120 includes capacitors, resistors, or inductors. In some embodiments, loop filter 120 includes at least one capacitive device.

First feedback control unit 130 includes a first feedback control output node 132 coupled to input node 122 of loop filter 120. First feedback control unit 130 is configured to receive oscillating signals VCOP and VCON and a reference pulse signal $V_{PULSE}$ and to adjust a voltage level at node 132, which in turn affects a voltage level of VCO control signal $V_{TUNE}$. First feedback control unit 130 further includes a phase detector 134 and a charge pump 136. Phase detector 134 is configured to generate a set of control signals PD_UP and PD_DN according to oscillating signals VCOP and VCON and reference pulse signal $V_{PULSE}$. Charge pump 136 is configured to inject charges to or extract charges from first feedback control output node 132. In the embodiment depicted in FIG. 1, first feedback control unit 130 is free of having a frequency divider.

In FIG. 1, the reference pulse signal $V_{PULSE}$ has a predetermined reference frequency $F_{REF}$ and a corresponding reference period $T_{REF}$. In some embodiments, a predetermined ratio of $T_{REF}$ to $T_{VCO}$ is (N+f), where N is a positive integer, and f is a fraction. For example, if the predetermined ratio of $T_{REF}$ to $T_{VCO}$ is 16.2, N is 16, and f is 0.2. In some embodiments, the predetermined ratio ranged from 2 to 40.

First feedback control unit 130 is configured to, during a cycle of reference pulse signal $V_{PULSE}$, apply a first current to first feedback control output node 132 along a first current direction for a variable period of time, and apply a second current to first feedback control output node 132 along a second current direction opposite the first current direction for a predetermined period of time. The first and second current directions are defined as injecting or extracting charges with respect to first feedback control output node 132. If oscillating signals VCOP and VCON are locked to reference pulse signal $V_{PULSE}$ according to the predetermined ratio (N+f), total charge injected into and extracted from first feedback control output node 132 is set to be zero in order to maintain voltage level of VCO control signal $V_{TUNE}$. Details regarding operations of first feedback control unit 130 will be further illustrated in conjunction with the following drawings.

Second feedback control unit 140 includes a second feedback control output node 142 coupled to input node 122 of loop filter 120. Second feedback control unit 140 is also configured to receive oscillating signals VCOP and VCON and reference pulse signal $V_{PULSE}$ and to adjust a voltage level at node 142, which also in turn affects the voltage level of VCO control signal $V_{TUNE}$. Second feedback control unit 140 further includes a phase-frequency detector 144, a charge pump 146, and a frequency divider 148.

Frequency divider 148 is configured to generate a pre-scaled signal $V_{DIV}$ based on first oscillating signal VCOP, second oscillating signal VCON, and the predetermined ratio (N+f). In some embodiments, pre-scaled signal $V_{DIV}$ does not have a period $T_{DIV}$ exactly equal the predetermined ratio (N+f) times the VCO period $T_{VCO}$. Rather, in some embodiments, pre-scaled signal $V_{DIV}$ has a variable period $T_{DIV}$, and an average of the ratio of period $T_{DIV}$ to period $T_{VCO}$ equals the predetermined ratio (N+f). For example, if the predetermined ratio of period $T_{REF}$ to period $T_{VCO}$ is 16.2, a ratio of period $T_{DIV}$ to period $T_{VCO}$ is, sequentially and repetitively, 16, 16, 16, 16, and 17.

Phase-frequency detector 144 is configured to generate a set of control signals, such as control signals PFD_UP and PFD_DN, based on a phase difference between the pre-scaled signal $V_{DIV}$ and the reference pulse signal $V_{PULSE}$. Charge pump 146 is configured to adjust a voltage level at the second feedback control output node 142 according to the set of control signals PFD_UP and PFD_DN.

In some embodiments, because second feedback control unit 140 includes frequency divider 148, controlling VCO 110 using second feedback control unit 140 consumes more power than controlling VCO 110 using first feedback control unit 130. Therefore, in some embodiments, second feedback control unit 140 is used primarily to lock oscillating signals VCOP and VCON to reference pulse signal $V_{PULSE}$, and first feedback control unit 130 is used primarily to maintain the locking status of the PLL 100 once oscillating signals VCOP and VCON are locked to reference pulse signal $V_{PULSE}$.

Controller 150 is configured to enable or disable the first feedback control unit 130 or the second feedback control unit 140. In some embodiments, controller 150 determines if first and second oscillating signals VCOP and VCON are locked to reference pulse signal $V_{PULSE}$ according to the predetermined ratio (N+f). In some embodiments, controller 150 enables second feedback control unit 140 and disables first feedback control unit 130 if the first and second oscillating signals VCOP and VCON are not locked to reference pulse signal $V_{PULSE}$. Thus, the voltage level at node 122 and VCO control voltage $V_{TUNE}$ are affected by second feedback control unit 140 but not by first feedback control unit 130. In some embodiments, controller 150 enables first feedback control unit 130 and disables second feedback control unit 140 after the first and second oscillating signals VCOP and VCON are locked to reference pulse signal $V_{PULSE}$. Thus, the voltage level at node 122 VCO control voltage $V_{TUNE}$ are affected by first feedback control unit 130 but not by second feedback control unit 140. In some embodiments, even if the oscillating signals VCOP and VCON are locked to reference pulse signal $V_{PULSE}$, controller 150 periodically enables second feedback control unit 140 and disables first feedback control unit 130.

In some embodiments, first feedback control unit 130 is capable of controlling VCO 110 to lock oscillating signals VCOP and VCON to reference pulse signal $V_{PULSE}$, and thus second feedback control unit 140 and controller 150 are omitted.

PLL 100 further includes a pulse generator 160 configured to generate reference pulse signal $V_{PULSE}$ based on a reference clock signal $CLK_{REF}$. Reference clock signal $CLK_{REF}$ also has the reference frequency $F_{REF}$ and the reference period $T_{REF}$. In some embodiments, reference clock signal $CLK_{REF}$ has a duty cycle of about 50%. In other words, during a cycle of the reference clock signal $CLK_{REF}$, reference clock signal $CLK_{REF}$ is set to a logic high value for about half of the reference period $T_{REF}$ and set to a logic low value for about half of the reference period $T_{REF}$. On the other hand, in some embodiments, reference pulse signal $V_{PULSE}$ is set to logic high value for less than VCO period $T_{VCO}$. In some embodiments, reference pulse signal $V_{PULSE}$ is set to logic high value for about half of VCO period $T_{VCO}$.

In some embodiments, because only a rising edge of the reference clock signal $CLK_{REF}$ or a rising edge of reference pulse signal $V_{PULSE}$ is used by first feedback control unit 130, second feedback control unit 140, or controller 150, reference clock signal $CLK_{REF}$ is used as reference pulse signal $V_{PULSE}$, and thus pulse generator 160 is omitted.

Figure 2:
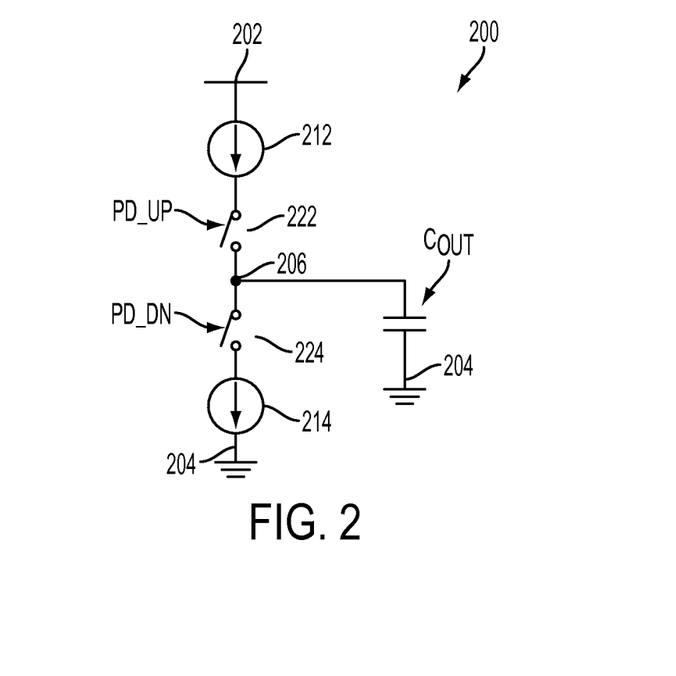
FIG. 2 is a schematic diagram of a charge pump in accordance with one or more embodiments.

FIG. 2 is a schematic diagram of a charge pump 200 in accordance with one or more embodiments. Charge pump 200 is usable as charge pump 136 in FIG. 1.

Charge pump 200 includes a supply voltage node 202, a ground reference node 204, and an output node 206. If charge pump 200 is used as charge pump 136 in FIG. 1, output node 206 is used as first feedback control output node 132. Capacitor $C_{OUT}$ is coupled between output node 206 and ground reference node 204 and is used to represent an equivalent external capacitance observable at output node 206. In some embodiments, capacitor $C_{OUT}$ is a hypothetical capacitor used to model at least an equivalent capacitance of loop filter 120. Also, switch 222 is controlled by control signal PD_UP, and switch 224 is controlled by control signal PD_DN.

Charge pump 200 further includes current sources 212 and 214 and switches 222 and 224. Current source 212 is coupled to supply voltage node 202, and switch 222 is coupled between current source 212 and output node 206. Current source 212 is configured to apply a predetermined amount of current $I_{CP1}$ to node 206, along a current injection direction with respect to output node 206, during a period of time when switch 222 is turned on. Current source 214 is coupled to ground reference node 204, and switch 224 is coupled between current source 214 and output node 206. Current source 214 is configured to apply one of K predetermined amounts of current ($I_{CP2}[0:K-1]$) to node 206, along a current withdrawal direction with respect to output node 206, during a period of time when switch 224 is turned on. K is a positive integer, and (K·f) is an integer.

In some embodiments, for a (k+1)-th cycle of reference pulse signal $V_{PULSE}$, current source 214 is set to have current $I_{CP2}[k]$, and $I_{CP1}$ and $I_{CP2}[k]$ have a relation of $I_{CP2}[k]=2 \cdot I_{CP1} \cdot (1-\text{fractional part of } (k \cdot f))$, k is an order index, which is an integer from 0 to K-1. Thus, the K predetermined amounts of current are selected in a sequential and repetitive manner according to the order index k. In some embodiments, when time period that switch 224 is turned on is set to $0.5 \cdot m \cdot T_{VCO}$, m is a positive integer, current $I_{CP1}$ and current $I_{CP2}$ have the relation of $m \cdot I_{CP2}[k]=2 \cdot I_{CP1} \cdot (1-\text{fractional part of } (k \cdot f))$.

The injection or withdrawal of current to and from output node 206 illustrated in this disclosure is used as an example. In some embodiments, current source 212 is configured to apply one of K predetermined amounts of current, and current source 214 is configured to apply a predetermined amount of current.

Figure 3:
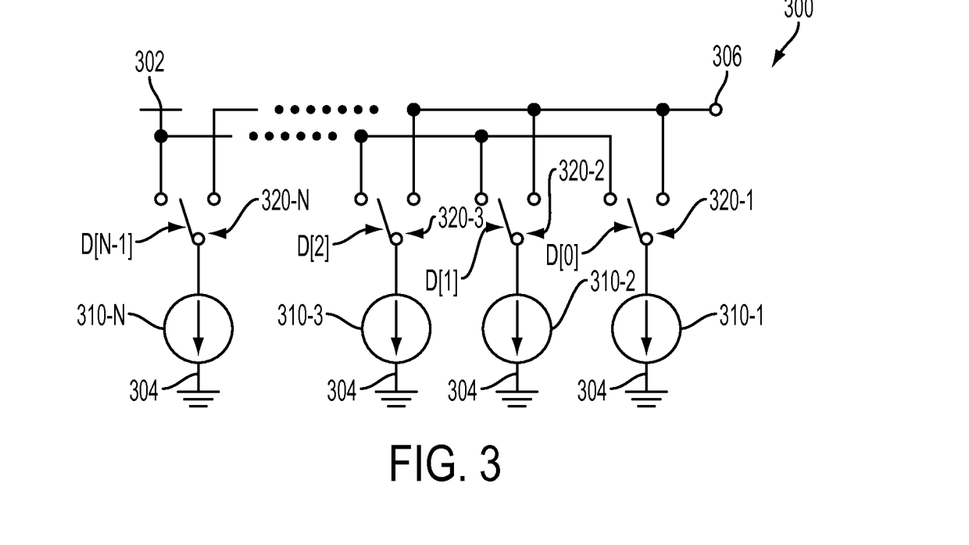
FIG. 3 is a schematic diagram of a current steering digital-to-analog converter (DAC) in accordance with one or more embodiments.

FIG. 3 is a schematic diagram of a current steering digital-to-analog converter (DAC) 300 in accordance with one or more embodiments. In some embodiments, DAC 300 is usable as the current source 214 in FIG. 2.

DAC 300 includes a power supply node 302, a ground reference node 304, and an output node 306. When DAC 300 is used as current source 241 in FIG. 2, output node 306 is coupled with switch 224. DAC 300 further includes N sub current sources 310-1 to 310-N coupled with ground reference node 304 and N switches 320-1 to 320-N coupled to corresponding N sub current sources 310-1 to 310-N. Switches 320-1 to 320-N are configured to direct currents provided by corresponding sub current sources 310-1 to 310-N to either output node 306 or power supply node 302 responsive to corresponding control signals D[0] to D[N−1]. N is a positive integer.

In some embodiments, sub current sources 310-1 to 310-N are configured to provide the same amount of current, and signals D[0:N−1] are coded in a unary coding format. In some embodiments, sub current sources 310-1 to 310-N are configured to provide various amounts of current corresponding to one of $2^0, 2^1, \ldots 2^{N-1}$ times of a predetermined unit current amount. Under these alternative circumstances, signals D[0:N−1] are coded in a binary coding format.

Figure 4:
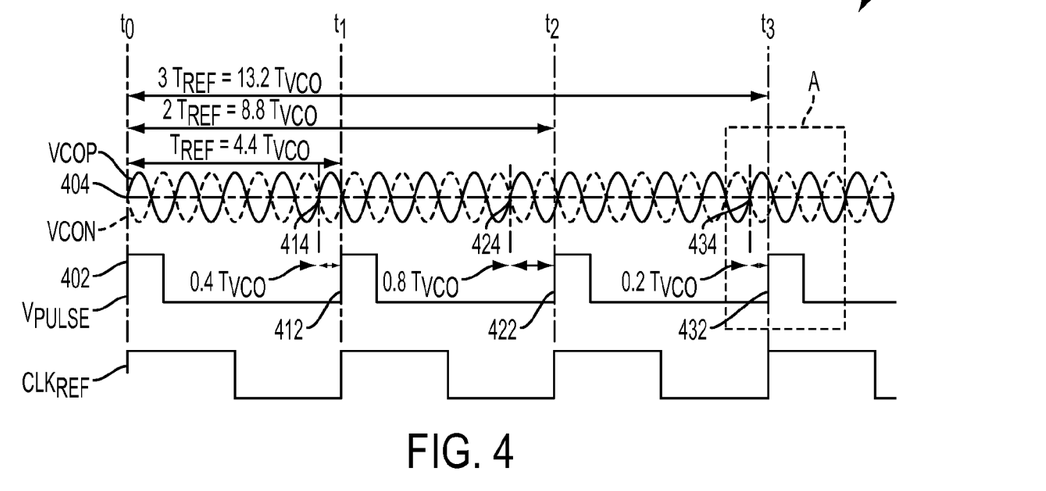
FIG. 4 is a timing diagram of signals at various nodes of a PLL in accordance with one or more embodiments.

FIG. 4 is a timing diagram 400 of signals at various nodes of a PLL, such as PLL 100 in FIG. 1 for example, in accordance with one or more embodiments. Timing diagram 400 depicts oscillating signals VCOP and VCON at nodes 112 and 114, reference clock signal $CLK_{REF}$ at an input node of pulse generator 160, and reference pulse signal $V_{PULSE}$ at an output node of pulse generator 160. Reference pulse signal $V_{PULSE}$ is derived from reference clock signal $CLK_{REF}$ by pulse generator 160, and thus reference pulse signal $V_{PULSE}$ and reference clock signal $CLK_{REF}$ has the same period $T_{REF}$. Oscillating signals VCOP and VCON has a period $T_{VCO}$, and a ratio of $T_{REF}$ to $T_{VCO}$ is (N+f), where N is 4 and f is 0.4 in the example depicted in FIG. 4. Also, oscillating signals VCOP and VCON are locked to reference pulse signal $V_{PULSE}$ in the example depicted in FIG. 4.

At time $t_0$, a rising edge 402 of reference pulse signal $V_{PULSE}$ and an occurrence (crossing-over point 404) of a voltage level of oscillating signal VCOP surpassing a voltage level of oscillating signal VCON are aligned together. At time $t_1$, because reference pulse signal $V_{PULSE}$ has a time period $T_{REF}$ that equals $4.4 \cdot T_{VCO}$, a rising edge 412 of reference pulse signal $V_{PULSE}$ is $0.4 \cdot T_{VCO}$ behind a corresponding crossing-over point 414 where the voltage level of oscillating signal VCOP surpasses the voltage level of oscillating signal VCON immediately prior to time $t_1$.

At time $t_2$, because reference pulse signal $V_{PULSE}$ has a time period $T_{REF}$ equals $4.4 \cdot T_{VCO}$, a rising edge 422 of reference pulse signal $V_{PULSE}$ and the raising edge 402 are separated by $2 \cdot T_{REF}$, which equals $8.8 \cdot T_{VCO}$. Thus, rising edge 422 is $0.8 \cdot T_{VCO}$ behind a corresponding crossing-over point 424 immediately prior to time $t_2$. At time $t_3$, because reference pulse signal $V_{PULSE}$ has a time period $T_{REF}$ equals $4.4 \cdot T_{VCO}$, a rising edge 432 of reference pulse signal $V_{PULSE}$ and the raising edge 402 are separated by $3 \cdot T_{REF}$, which equals $13.2 \cdot T_{VCO}$. Thus, rising edge 432 is $0.2 \cdot T_{VCO}$ behind a corresponding crossing-over point 434 immediately prior to time $t_3$. Similarly, the next rising edge of reference pulse signal $V_{PULSE}$ after rising edge 432 is $0.6 \cdot T_{VCO}$ behind a corresponding crossing-over point of oscillating signals VCOP and VCON immediately preceding the next rising edge. Also, the further next rising edge of reference pulse signal $V_{PULSE}$ is aligned with a corresponding crossing-over point of oscillating signals VCOP and VCON.

In other words, a timing gap between crossing-over points of oscillating signals VCOP and VCON and rising edges of reference pulse signal $V_{PULSE}$ are 0, 0.4, 0.8, 0.2, and 0.6 times of $T_{VCO}$, in a sequential and repetitive manner. Therefore, when oscillating signals VCOP and VCON is locked to reference pulse signal $V_{PULSE}$, the timing differences between rising edges of reference pulse signal $V_{PULSE}$ and oscillating signals VCOP and VCON are known values.

Therefore, in some embodiments, if K is a smallest positive integer that would make (K·f) an integer, a time difference of the (k+1)-th rising edge of reference pulse signal $V_{PULSE}$ to an immediately preceding crossing-over point where oscillating signals VCOP surpasses oscillating signal VCON has the expression of (fractional part of (k·F)·$T_{VCO}$, k is an order index from 0 to K−1. The timing difference repeats every K cycles of reference pulse signal $V_{PULSE}$, in a sequential and repetitive manner.

In the given example, rising edges of reference pulse signal $V_{PULSE}$ and the occurrence of the voltage level of oscillating signal VCOP surpassing the voltage level of oscillating signal VCON are used for illustration purposes. In some embodiments, the phase comparison and timing difference is determined by rising and/or falling edges of reference pulse signal $V_{PULSE}$ and occurrences of oscillating signal VCOP surpassing oscillating signal VCON and/or oscillating signal VCON surpassing oscillating signal VCOP.

Figure 5:
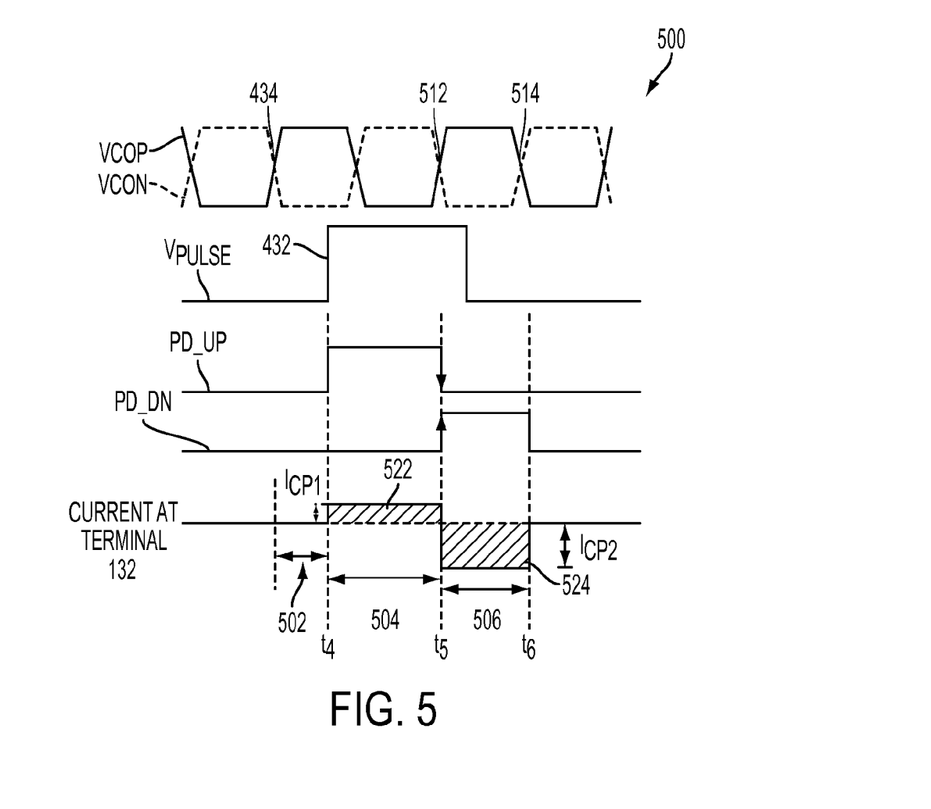
FIG. 5 is a timing diagram of signals at various nodes of a PLL corresponding to portion A in FIG. 4 in accordance with one or more embodiments.

FIG. 5 is a timing diagram 500 of signals at various nodes of a PLL, such as PLL 100 for example, corresponding to portion A in FIG. 4 in accordance with one or more embodiments. In order to control VCO 110 to lock oscillating signals VCOP and VCON to reference pulse signal $V_{PULSE}$, VCO control signal $V_{TUNE}$ is adjusted to maintain a timing difference (e.g., time period 502) between a rising edge of reference pulse signal (e.g., rising edge 432) and a corresponding crossing-over point of oscillating signals VCOP and VCON (e.g., point 434).

In this regard, a feedback control unit, such as first feedback control unit 130, is configured to apply a first current to control output node, such as node 132, along a first current direction for a variable period of time 504 defined by edge 432 and crossing-over point 512. Crossing over point 512 denotes the occurrence of the voltage level of oscillating signal VCOP surpassing the voltage level of oscillating signal VCON next to crossing-over point 434. Also, feedback control unit 130 is configured to apply a second current to control output node 132 along a second current direction opposite the first current direction for a predetermined period of time 506. Predetermined period of time 506 is defined by crossing-over point 512 and crossing-over point 514, which denotes the occurrence of the voltage level of oscillating signal VCON surpassing the voltage level of oscillating signal VCOP. The first feedback control unit 130 is arranged to cause net charge change at first feedback control output node 132 during time periods 504 and 506 to be zero if the timing relationship between crossing-over point 434 and rising edge 432 is maintained.

Therefore, in this embodiment, at time $t_4$, control signal PD_UP is set to a logic high value responsive to rising edge 432 of the reference pulse signal $V_{PULSE}$. Then, at time $t_5$, control signal PD_UP is set to a logic low value and control signal PD_DN is set to the logic high value responsive to a crossing-over point 512 where the voltage level of oscillating signal VCOP surpasses the voltage level of oscillating signal VCON. Finally, at time $t_6$, control signal PD_DN is set to the logic low value responsive to a crossing-over point 514 the voltage level of oscillating signal VCON surpasses the voltage level of oscillating signal VCOP.

As illustrated in conjunction with FIG. 2, in some embodiments, for a (k+1)-th cycle of reference pulse signal $V_{PULSE}$, current source 214 is set to have current $I_{CP2}[k]$, and $I_{CP1}$ and $I_{CP2}[k]$ have a relation of $I_{CP2}[k]=2 \cdot I_{CP1} \cdot (1-$fractional part of $(k \cdot f))$, k is an integer from 0 to K−1. Also, as illustrated in conjunction with FIGS. 4 and 5, in some embodiments, for the (k+1)-th cycle of reference pulse signal $V_{PULSE}$, a timing difference $T_{DIFF}[k]$ (e.g., time period 502) between rising edge of reference pulse signal $V_{PULSE}$ and an immediately preceding crossing-over point where signal VCOP surpasses signal VCON has a relation of $T_{DIFF}[k]=T_{VCO} \cdot$fractional part of $(k \cdot f)$. As depicted in FIG. 5, time period 504 is thus $T_{VCO} \cdot (1-$fractional part of $(k \cdot f))$, and time period 506 is set to be $0.5 \cdot T_{VCO}$.

In the FIG. 5 embodiment, total charge injected into node 132 (as depicted by area 522) during time period 504 is $I_{CP1} \cdot T_{VCO} \cdot (1-$fractional part of $(k \cdot f))$, and total charge withdrawn from node 132 (as depicted by area 524) during time period 506 is $2 \cdot I_{CP1} \cdot (1-$fractional part of $(k \cdot f)) \cdot 0.5 \cdot T_{VCO}$. Comparing areas 522 and 524 and the mathematical expressions above, if oscillating signals VCOP and VCON are locked to reference pulse signal $V_{PULSE}$, net charge changes at node 132 is zero, and first feedback control unit 130 is thus capable of controlling VCO 110 to maintain a predetermined timing difference $T_{DIFF}[k]$.

In some embodiments, time period 506 is set to a value different than $0.5 \cdot T_{VCO}$. In some embodiments, time period 506 is set to $T_{VCO}$, $1.5 \cdot T_{VCO}$, any multiple of $0.5 \cdot T_{VCO}$, or any predetermined time span. In this regard, in some embodiments, current $I_{CP1}$ and/or current $I_{CP2}$ are scaled accordingly in order to maintain zero net charge changes if oscillating signals VCOP and VCON are locked to reference pulse signal $V_{PULSE}$. For example, in some embodiments when time period 506 is set to $0.5 \cdot m \cdot T_{VCO}$, m is a positive integer, current $I_{CP1}$ and current $I_{CP2}$ have the relation of $m \cdot I_{CP2}[k]=2 \cdot I_{CP1} \cdot (1-$fractional part of $(k \cdot f))$.

Moreover, in some embodiments, first feedback control unit 130 is further configured to apply no net current to the first feedback control output node 132 during a cycle of the reference pulse signal $V_{PULSE}$ that the rising edge of the reference pulse signal (e.g., edge 402 in FIG. 4) is approximately aligned with a crossing-over point (e.g., point 404) the voltage level of oscillating signal VCOP surpasses the voltage level of oscillating signal VCON. In other words, in some embodiments, control signals PD_UP is set to the logic low level during the first (k=0) of K cycles of reference pulse signal $V_{PULSE}$.

Figure 6:
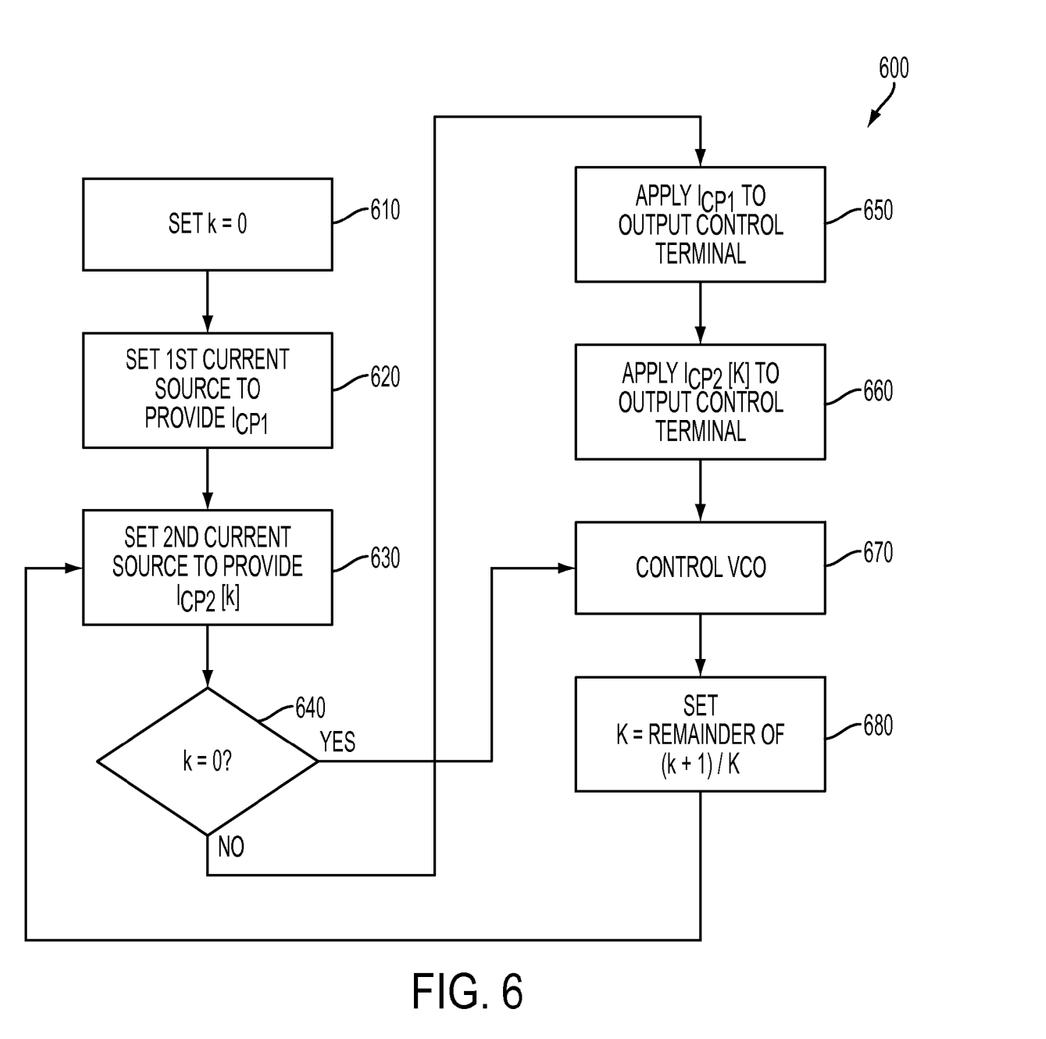
FIG. 6 is a flowchart of a method of operating a PLL in accordance with one or more embodiments.

FIG. 6 is a flowchart of a method 600 of operating a PLL in accordance with one or more embodiments. It is understood that additional operations may be performed before, during, and/or after the method 600 depicted in FIG. 6, and that some other processes may only be briefly described herein.

The PLL, such as PLL 100 in FIG. 1, is configured to output oscillating signals VCOP and VCON having a time period $T_{VCO}$ synthesized based on a reference pulse signal $V_{PULSE}$ having a time period $T_{REF}$. A predetermined ratio of $T_{REF}$ to $T_{VCO}$ is (N+f), where N is a positive integer, and f is a fraction. K is the smallest positive integer that $(K \cdot f)$ is an integer.

In operation 610, an order index k is set to 0 by a control unit, such as first feedback control unit 130 in FIG. 1, k is an integer from 0 to (K−1). In operation 620, a first current source, such as current source 212 in FIG. 2, is set to have a first predetermined amount of current ($I_{CP1}$) having a first current direction with respect to a control output node of feedback control unit, such as node 132.

In operation 630, during a (k+1)-th cycle of reference pulse signal $V_{PULSE}$, a second current source, such as current source 214, is set to have (k+1)-th of K predetermined amounts of current ($I_{CP2}[0:K-1]$) having a second current direction with respect to the control output node 132. In some embodiments, first and second current has a relation of $I_{CP2}[k]=2 \cdot I_{CP1} \cdot (1-$fractional part of $(k \cdot f))$. In some embodiments, the K predetermined amounts of current are selected in a sequential and repetitive manner according to the order index k.

In operation 640, control unit 130 determines if the order index k equals 0. If order index k is not 0, the method proceeds to operation 650.

In operation 650, the first current $I_{CP1}$ is applied to control output node 132 during a first period of time. In some embodiments, the first period of time is a variable time period defined by a rising edge of the reference pulse signal and a crossing-over point when a voltage level of oscillating signal VCOP surpasses a voltage level of oscillating signal VCON during a current cycle of the reference pulse signal.

In operation 660, the second current $I_{CP2}$ is applied to the control output node 132 during a second period of time. In some embodiments, the second period of time is a predetermined time period defined by the crossing-point when the voltage level of oscillating signal VCOP surpasses the voltage level of oscillating signal VCON and the crossing-point when the voltage level of oscillating signal VCON surpasses the voltage level of oscillating signal VCOP during a current cycle of the reference pulse signal.

In operation 670, VCO 110 is controlled to output oscillating signals VCOP and VCON according to a voltage level at the control output node 132. The method proceeds to operation 680, where order index k is updated to be the remainder of (k+1)/K, which is still a non-negative integer. In other words, each time order index k is updated according to the sequence of 0, 1, 2, 3, . . . , and K−1 in a sequential and repetitive manner. The method then proceeds to operation 630.

Referring back to operation 640, if the current order index k is 0, the method proceeds to operation 670, and operations 650 and 660 are skipped. Therefore, first feedback control unit 130 applies no net current to the control output node 132 during a cycle of the reference signal that a first edge of the reference signal is approximately aligned with a crossing-over point when the voltage level of oscillating signal VCOP surpasses the voltage level of oscillating signal VCON.

In some embodiments, operation 640 is omitted, and operation 630 is thus followed by operation 650 and operations 650 and 660 are still performed when order index k is 0.

In accordance with one embodiment, a phase locked loop (PLL) includes a voltage controlled oscillator (VCO), a loop filter, and a feedback control unit. The VCO is configured to generate a first oscillating signal and a second oscillating signal according to a VCO control signal. The second oscillating signal is an inverted version of the first oscillating signal. The first and second oscillating signals have a predetermined VCO period ($T_{VCO}$). The loop filter is configured to output the VCO control signal by low-pass filtering a signal at an input node of the loop filter. The feedback control unit has an output node coupled to the input node of the loop filter, the feedback control unit is configured to apply a first predetermined amount of current ($I_{CP1}$), along a first current direction, to the first feedback control output node during a variable period of time; and to apply one of K second predetermined amounts of current ($I_{CP2}[0:K-1]$), along a second current direction opposite the first current direction, to the first feedback control output node during a predetermined period of time. The variable period of time is defined by a reference signal, the first oscillating signal, and the second oscillating signal. The reference signal has a predetermined reference period ($T_{REF}$), and a predetermined ratio of $T_{REF}$ to $T_{VCO}$ is (N+f), where N is an integer part of (N+f) and f is a fractional part of (N+f). The K second predetermined amounts of current are selected in a sequential and repetitive manner, where K is a positive integer, and (K·f) is an integer.

In accordance with another embodiment, a control unit includes an output node, a phase detector, and a charge pump. The phase detector is configured to generate a set of control signals based on a reference signal, a first oscillating signal, and a second oscillating signal. The reference signal has a predetermined reference period ($T_{REF}$), the second oscillating signal is an inverted version of the first oscillating signal, and the first and second oscillating signals has a predetermined VCO period ($T_{VCO}$). A predetermined ratio of $T_{REF}$ to $T_{VCO}$ being (N+f), where N is an integer part of (N+f), and f is a fractional part of (N+f). The charge pump includes a first current source, a first switch, a second current source, and a second switch. The first current source is configured to provide a first predetermined amount of current ($I_{CP1}$) having a first current direction with respect to the output node. The first switch is between the output node and the first current source and controlled by a first one of the set of control signals. The second current source is configured to provide one of K second predetermined amounts of current ($I_{CP2}[0:K-1]$) having a second current direction with respect to the output node, where K is a positive integer, and (K·f) is an integer. The second switch is between the first feedback control output node and the second current source and controlled by a second one of the set of control signals.

In accordance with another embodiment, a method of operating a phase locked loop (PLL) includes setting a first current source to have a first predetermined amount of current ($I_{CP1}$) having a first current direction with respect to a control output node, where K is a positive integer. During a (k+1)-th cycle of a reference signal, k being an integer from 0 to K-1, a second current source is set to have (k+1)-th of K predetermined amounts of current ($I_{CP2}[0:K-1]$) having a second current direction with respect to the control output node. The first current is applied to the control output node during a variable period of time defined according to a reference signal, a first oscillating signal, and a second oscillating signal. The reference signal has a predetermined reference period ($T_{REF}$), the second oscillating signal is an inverted version of the first oscillating signal, the first and second oscillating signals has a predetermined VCO period ($T_{VCO}$). A predetermined ratio of $T_{REF}$ to $T_{VCO}$ is (N+f), where N is an integer part of (N+f), f is a fractional part of (N+f), and (K·f) is an integer. The second current is applied to the control output node during a predetermined period of time. A voltage controlled oscillator is controlled to output the first and second oscillating signals according to a voltage level at the control output node.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A phase locked loop (PLL), comprising:
    a voltage controlled oscillator (VCO) configured to generate a first oscillating signal and a second oscillating signal according to a VCO control signal, the second oscillating signal being an inverted version of the first oscillating signal, the first and second oscillating signals having a predetermined VCO period ($T_{VCO}$);
    a loop filter configured to output the VCO control signal by low-pass filtering a signal at an input node of the loop filter; and
    a first feedback control unit having a first feedback control output node coupled to the input node of the loop filter, the first feedback control unit being configured to
        apply a first predetermined amount of current ($I_{CP1}$), along a first current direction, to the first feedback control output node during a variable period of time, the variable period of time being defined by a reference signal, the first oscillating signal, and the second oscillating signal, the reference signal having a predetermined reference period ($T_{REF}$), a predetermined ratio of $T_{REF}$ to $T_{VCO}$ being (N+f), N being a positive integer, and f being a fraction; and
        apply one of K second predetermined amounts of current ($I_{CP2}[0:K-1]$), along a second current direction opposite the first current direction, to the first feedback control output node during a predetermined period of time, the K second predetermined amounts of current being selected in a sequential and repetitive manner, K being a positive integer, and (K·f) being an integer.

2. The PLL of claim 1, wherein the first feedback control unit comprises a phase detector configured to, during a cycle of the reference signal,
    set a first control signal to a first logic value responsive to a first edge of the reference signal;
    set the first control signal to a second logic value and set a second control signal to the first logic value responsive to an occurrence of a voltage level of the first oscillating signal surpassing a voltage level of the second oscillating signal; and
    set the second control signal to the second logic value responsive to an occurrence of the voltage level of the second oscillating signal surpassing the voltage level of the first oscillating signal.

3. The PLL of claim 2, wherein, during the cycle of the reference signal, the first control signal is set to the first logic value for a time period less than $T_{VCO}$, the second control signal is set to the first logic value for about $0.5 \cdot m \cdot T_{VCO}$, and m is a positive integer.

4. The PLL of claim 1, wherein, during a cycle of the reference signal, the reference signal is set to a logic high value for less than $T_{VCO}$.

5. The PLL of claim 1, wherein the first feedback control unit comprises a charge pump, comprising:
    a first current source configured to provide the first predetermined amount of current;
    a first switch between the first feedback control output node and the first current source;
    a second current source configured to provide the one of K second predetermined amounts of current; and a second switch between the first feedback control output node and the second current source.

6. The PLL of claim 5, wherein the second current source is a current-steering digital-to-analog converter controllable by a set of binary signals.

7. The PLL of claim 1, wherein the predetermined period of time for applying the one of K second predetermined amounts of current is set to be $0.5 \cdot m \cdot T_{VCO}$, m is a positive integer, and $I_{CP1}$ and $I_{CP2}[k]$ have a relation of
$m \cdot I_{CP2}[k] = 2 \cdot I_{CP1} \cdot (1 - \text{fractional part of } (k \cdot f))$, k is an integer from 0 to K−1.

8. The PLL of claim 1, further comprising a second feedback control unit having a second feedback control output node, the second feedback control output node being coupled to the input node of the loop filter, and the second feedback control unit comprising:
a frequency divider configured to generate a pre-scaled signal based on the first oscillating signal, the second oscillating signal, and the predetermined ratio (N+f);
a phase-frequency detector configured to generate a set of control signals based on a phase difference between the pre-scaled signal and the reference signal; and
a charge pump configured to adjust a voltage level at the second feedback control output node according to the set of control signals.

9. The PLL of claim 8, further comprising a controller configured to enable the first feedback control unit or the second feedback control unit.

10. The PLL of claim 9, wherein the controller is configured to
determine if the first and second oscillating signals are locked to the reference signal according to the predetermined ratio (N+f);
enable the second feedback control unit and disable the first feedback control unit if the first and second oscillating signals are not locked to the reference signal; and
enable the first feedback control unit and disable the second feedback control unit after the first and second oscillating signals are locked to the reference signal.

11. The PLL of claim 9, wherein the controller is configured to
periodically enable the second feedback control unit and disable the first feedback control unit.

12. The PLL of claim 1, further comprising:
a pulse generator configured to generate the reference signal according to a reference clock signal.

13. The PLL of claim 1, wherein the first feedback control unit is further configured to apply no net current to the first feedback control output node during a cycle of the reference signal in which a first edge of the reference signal is approximately aligned with an occurrence of a voltage level of the first oscillating signal surpassing a voltage level of the second oscillating signal.

14. A control unit, comprising:
an output node;
a phase detector configured to generate a set of control signals based on a reference signal, a first oscillating signal, and a second oscillating signal, the reference signal having a predetermined reference period ($T_{REF}$), the second oscillating signal being an inverted version of the first oscillating signal, the first and second oscillating signals having a predetermined VCO period ($T_{VCO}$), a predetermined ratio of $T_{REF}$ to $T_{VCO}$ being (N+f), N being a positive integer, and f being a fraction; and
a charge pump, comprising:
a first current source configured to provide a first predetermined amount of current ($I_{CP1}$) having a first current direction with respect to the output node;
a first switch between the output node and the first current source and controlled by a first one of the set of control signals;
a second current source configured to provide one of K second predetermined amounts of current ($I_{CP2}[0:K−1]$) having a second current direction with respect to the output node, K being a positive integer, and (K·f) being an integer, the K second predetermined amounts of current ($I_{CP2}[0:K−1]$) being sequentially selected; and
a second switch between the first feedback control output node and the second current source and controlled by a second one of the set of control signals.

15. The control unit of claim 14, wherein the second current source is a current-steering digital-to-analog converter controllable by a set of binary signals.

16. The control unit of claim 14, wherein the second switch is configured to be turned on for a time period of $0.5 \cdot m \cdot T_{VCO}$, m is a positive integer, $I_{CP1}$ and $I_{CP2}[k]$ have a relation of
$m \cdot I_{CP2}[k] = 2 \cdot I_{CP1} \cdot (1 - \text{fractional part of } (k \cdot f))$, k is an integer from 0 to K−1.

17. A method of operating a phase locked loop (PLL), the method comprising:
setting a first current source to have a first predetermined amount of current ($I_{CP1}$) having a first current direction with respect to a control output node, K being a positive integer;
during a (k+1)-th cycle of a reference signal, k being an integer from 0 to K−1, setting a second current source to have (k+1)-th of K predetermined amounts of current ($I_{CP2}[0:K−1]$) having a second current direction with respect to the control output node,
applying the first predetermined amount of current to the control output node during a variable period of time defined according to a reference signal, a first oscillating signal, and a second oscillating signal, the reference signal having a predetermined reference period ($T_{REF}$), the second oscillating signal being an inverted version of the first oscillating signal, the first and second oscillating signals having a predetermined VCO period ($T_{VCO}$), a predetermined ratio of $T_{REF}$ to $T_{VCO}$ being (N+f), N being a positive integer, f being a fraction, and (K·f) being an integer;
applying the (k+1)-th of K predetermined amounts of current to the control output node during a predetermined period of time; and
controlling a voltage controlled oscillator to output the first and second oscillating signals according to a voltage level at the control output node.

18. The method of claim 17, wherein
the variable period of time is defined by a first edge of the reference signal and an occurrence of a voltage level of the first oscillating signal surpassing a voltage level of the second oscillating signal during a cycle of the reference signal.

19. The method of claim 17, wherein
the predetermined period of time is defined by an occurrence of a voltage level of the first oscillating signal surpassing a voltage level of the second oscillating signal and an occurrence of the voltage level of the second oscillating signal surpassing the voltage level of the first oscillating signal during a cycle of the reference signal.

20. The method of claim 17, wherein the predetermined period of time for applying the (k+1)-th of K predetermined amounts of current to the control output node is set to be $0.5 \cdot m \cdot T_{VCO}$, m is a positive integer, and the first predetermined amount of current and the (k+1)-th of K predetermined amounts of current have a relation of $m \cdot I_{CP2}[k] = 2 \cdot I_{CP1} \cdot (1 - \text{fractional part of } (k \cdot f))$.

* * * * *